(12) United States Patent
Lee et al.

(10) Patent No.: US 10,644,026 B2
(45) Date of Patent: May 5, 2020

(54) SEMICONDUCTOR DEVICE AND MANUFACTURING METHOD THEREOF

(71) Applicant: SK hynix Inc., Gyeonggi-do (KR)

(72) Inventors: Nam Jae Lee, Chungcheongbuk-do (KR); Jung Dal Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/229,035

(22) Filed: Dec. 21, 2018

(65) Prior Publication Data

US 2019/0363100 A1  Nov. 28, 2019

(30) Foreign Application Priority Data

May 23, 2018 (KR) .................. 10-2018-0058184

(51) Int. Cl.
| | |
|---|---|
| G11C 11/34 | (2006.01) |
| G11C 16/04 | (2006.01) |
| H01L 27/11582 | (2017.01) |
| H01L 23/528 | (2006.01) |
| G11C 16/14 | (2006.01) |
| H01L 23/532 | (2006.01) |
| H01L 27/11556 | (2017.01) |
| H01L 27/24 | (2006.01) |
| G11C 13/00 | (2006.01) |

(52) U.S. Cl.
CPC .... *H01L 27/11582* (2013.01); *G11C 13/0097* (2013.01); *G11C 16/0483* (2013.01); *G11C 16/14* (2013.01); *H01L 23/528* (2013.01); *H01L 23/53257* (2013.01); *H01L 23/53271* (2013.01); *H01L 27/11556* (2013.01); *H01L 27/249* (2013.01); *G11C 2213/71* (2013.01); *G11C 2213/75* (2013.01)

(58) Field of Classification Search
CPC ............. H01L 27/11582; H01L 23/528; H01L 23/53257; H01L 23/53271; H01L 27/11556; H01L 27/249; G11C 13/0097; G11C 16/0483; G11C 16/14
See application file for complete search history.

(56) References Cited

U.S. PATENT DOCUMENTS

| | | | | |
|---|---|---|---|---|
| 2017/0133389 | A1* | 5/2017 | Yun | ..................... H01L 23/5226 |
| 2017/0352552 | A1* | 12/2017 | Lee | ........................ H01L 21/486 |
| 2018/0151672 | A1* | 5/2018 | Choi | .................. H01L 27/11524 |
| 2018/0247949 | A1* | 8/2018 | Choi | .................. H01L 27/11556 |
| 2018/0342528 | A1* | 11/2018 | Lee | .................... H01L 27/11556 |
| 2019/0115358 | A1* | 4/2019 | Lee | .................... H01L 27/11582 |

FOREIGN PATENT DOCUMENTS

| | | |
|---|---|---|
| KR | 1020150081393 | 7/2015 |
| KR | 1020180098922 | 9/2018 |

* cited by examiner

*Primary Examiner* — Toan K Le
(74) *Attorney, Agent, or Firm* — IP & T Group LLP

(57) ABSTRACT

A semiconductor device includes: a stack structure; a source connection structure penetrating the stack structure; n first channel rows located at one side of the source connection structure, the n first channel rows including channel patterns; and n+k second channel rows located at the other side of the source connection structure, at least one channel row among the n+k second channel rows including dummy channel patterns, wherein the n and k are integers.

15 Claims, 17 Drawing Sheets

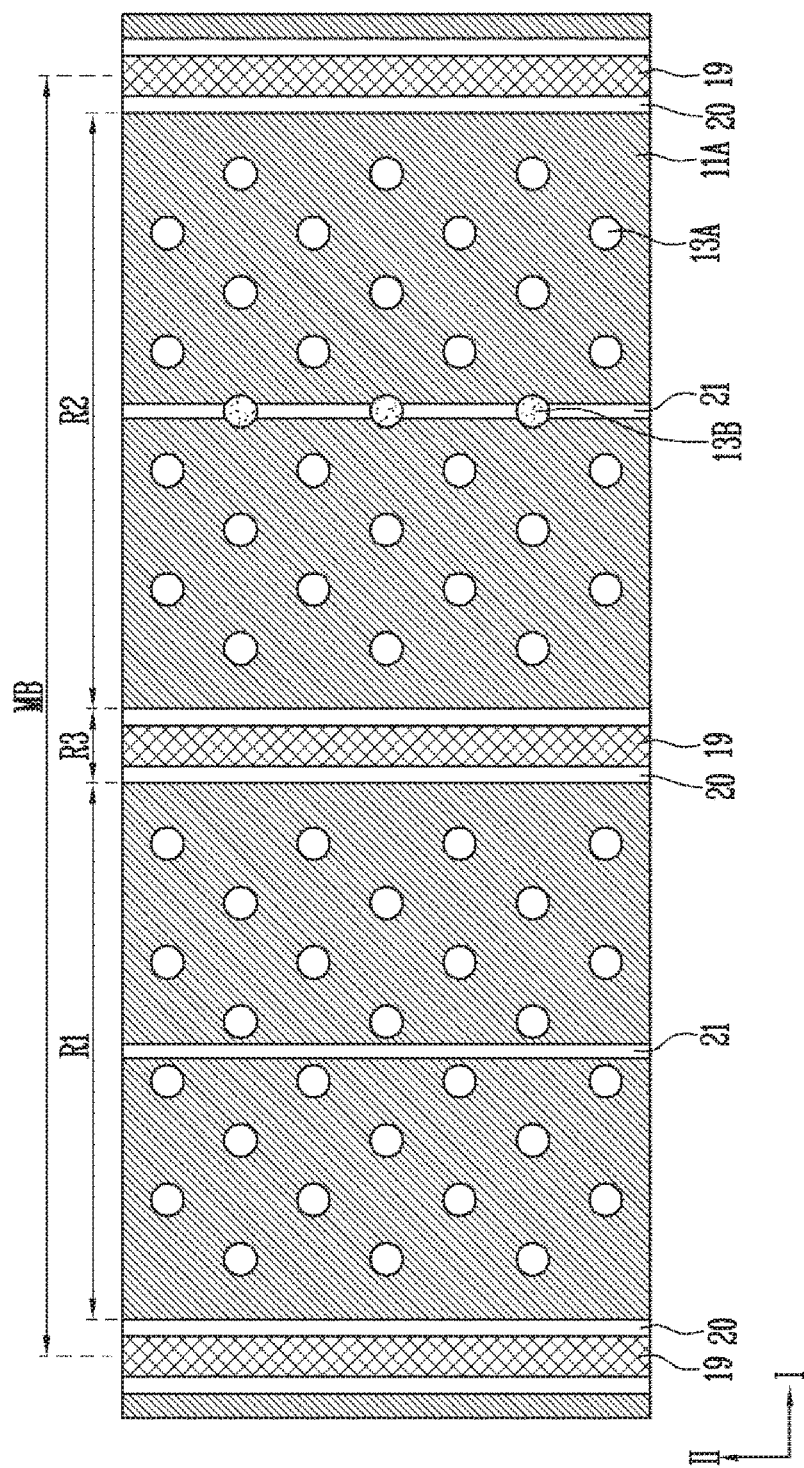

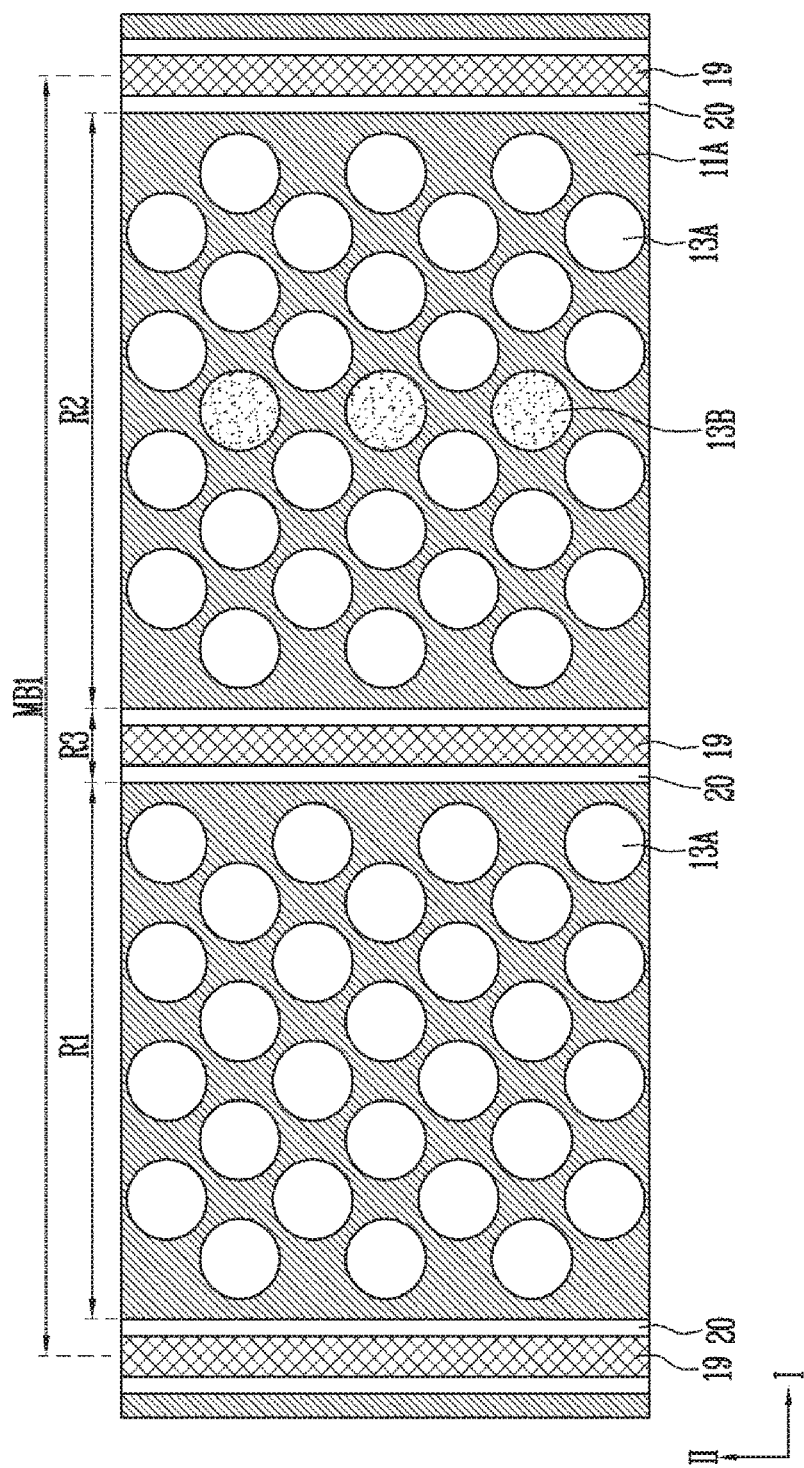

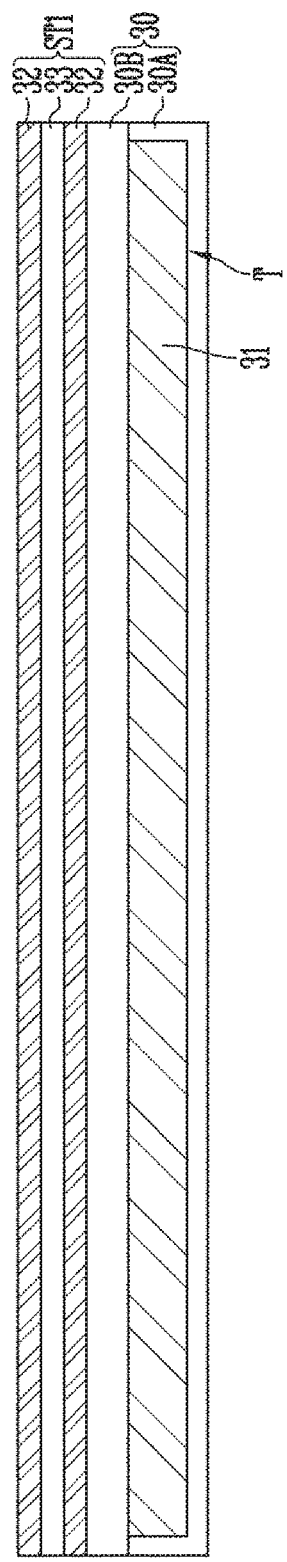
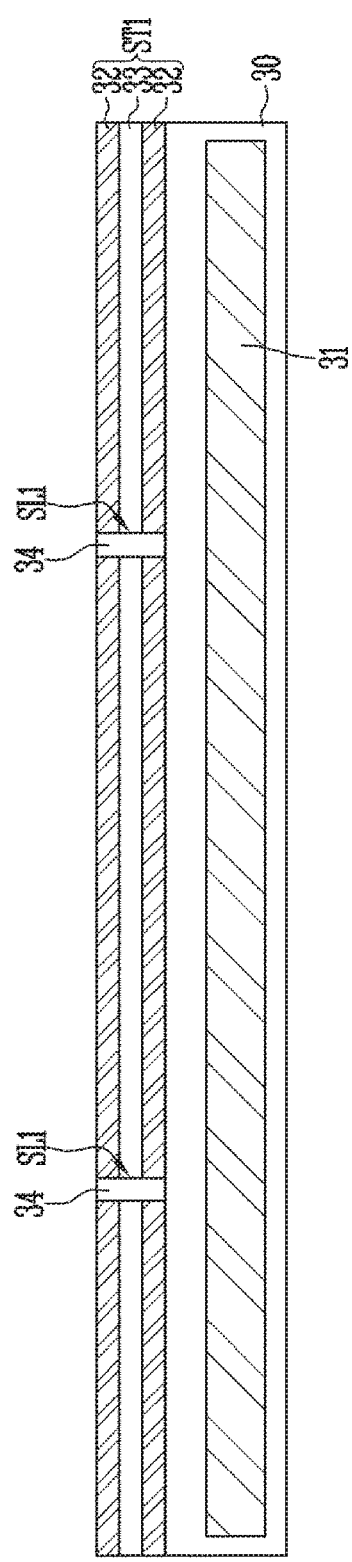

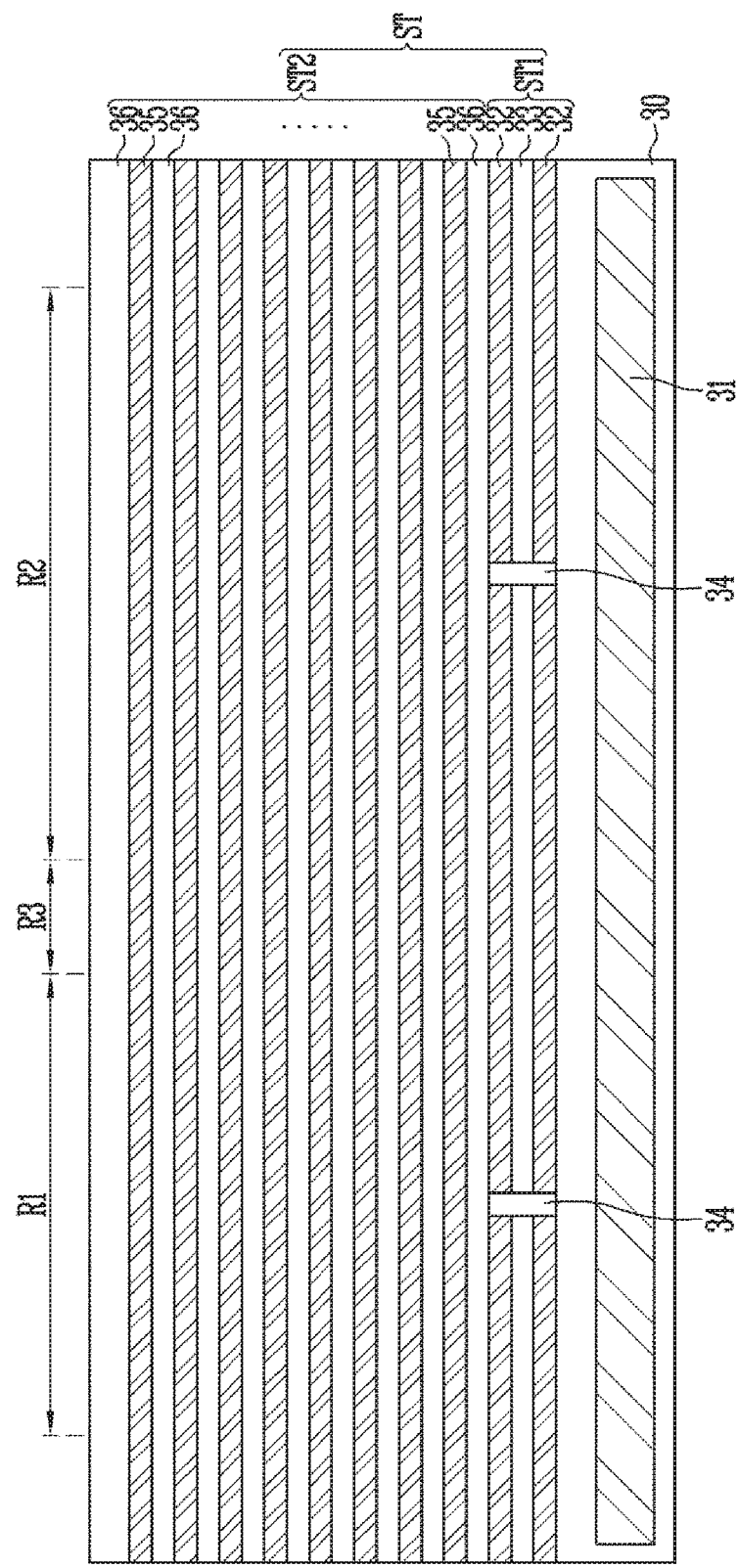

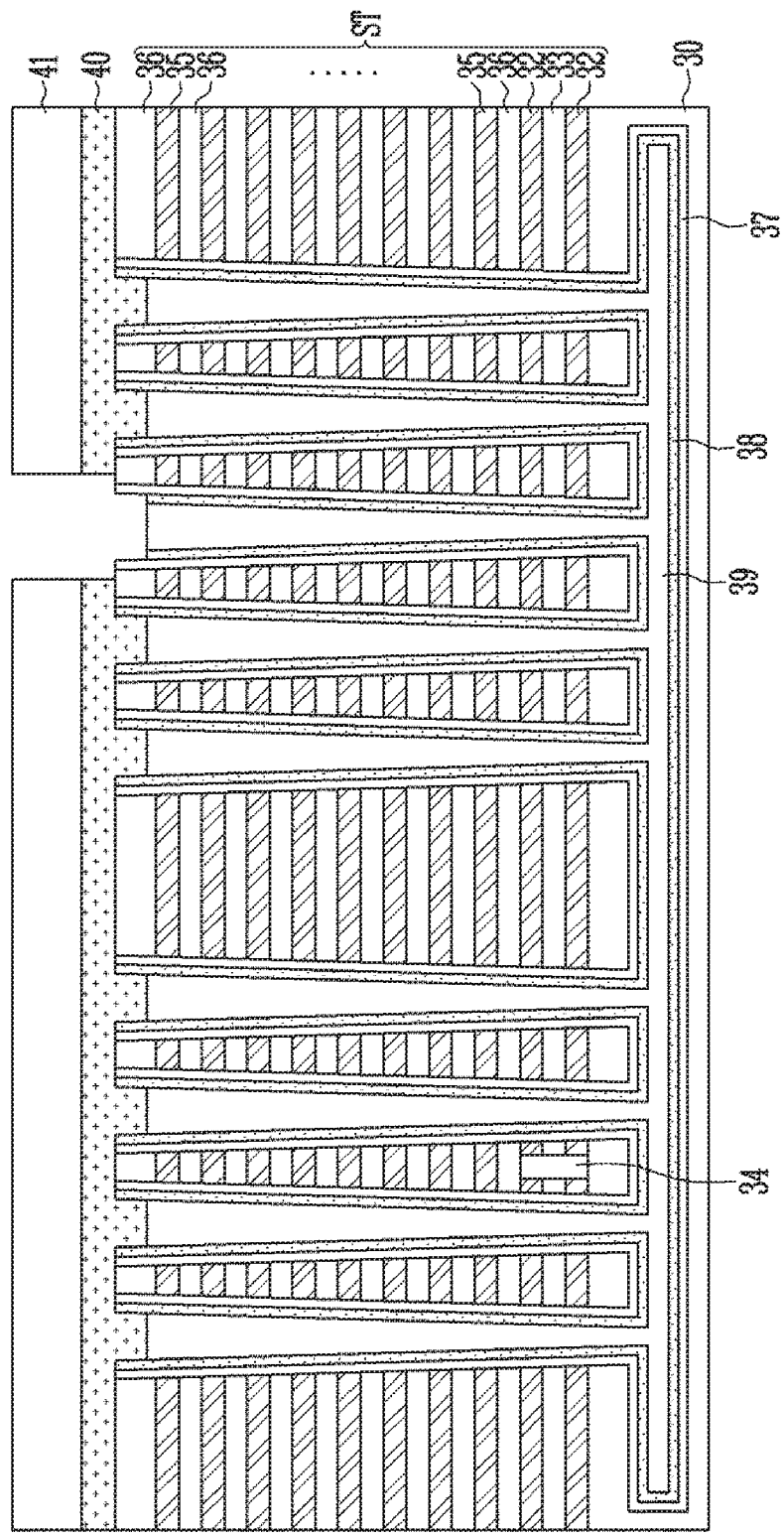

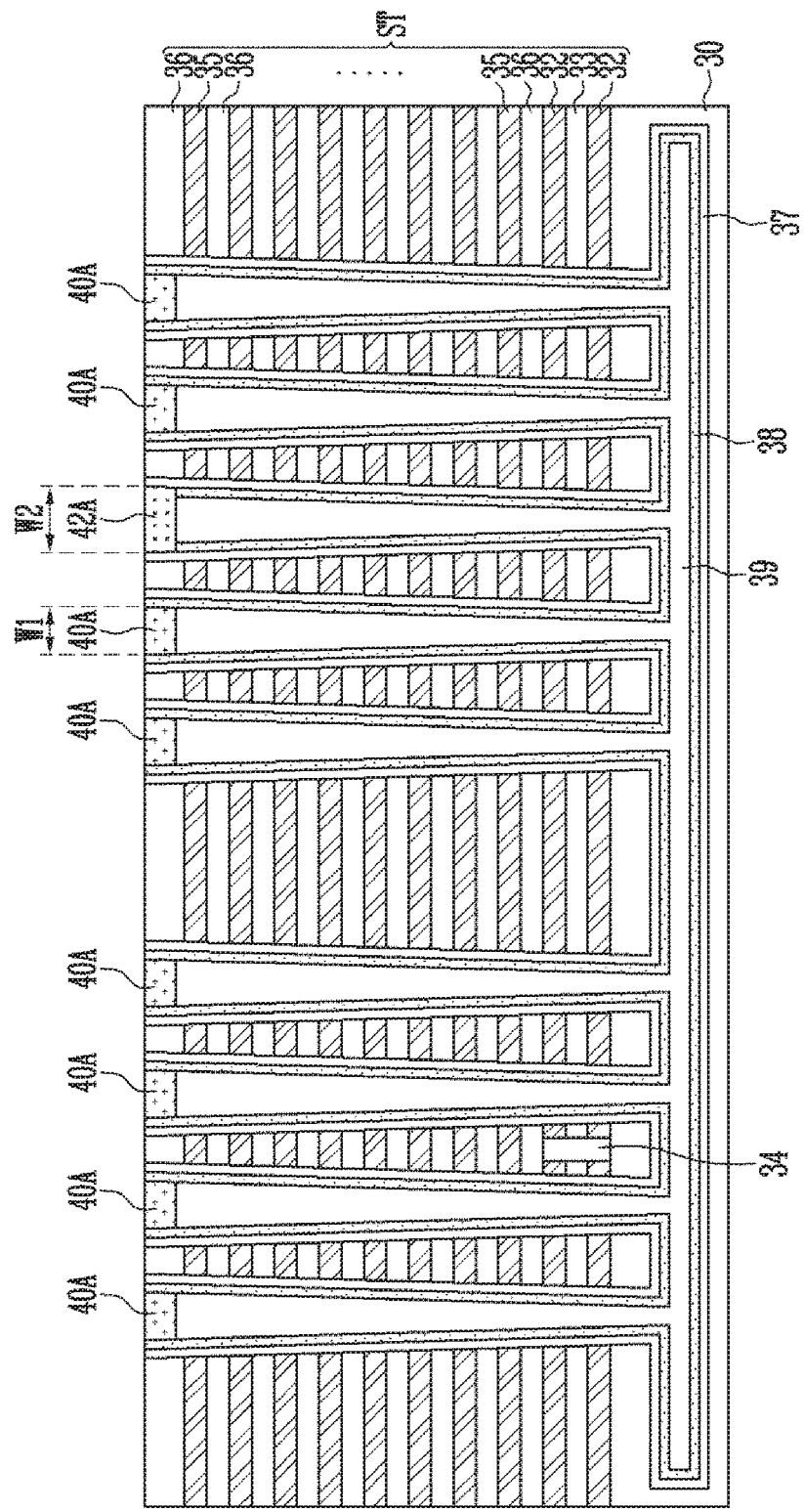

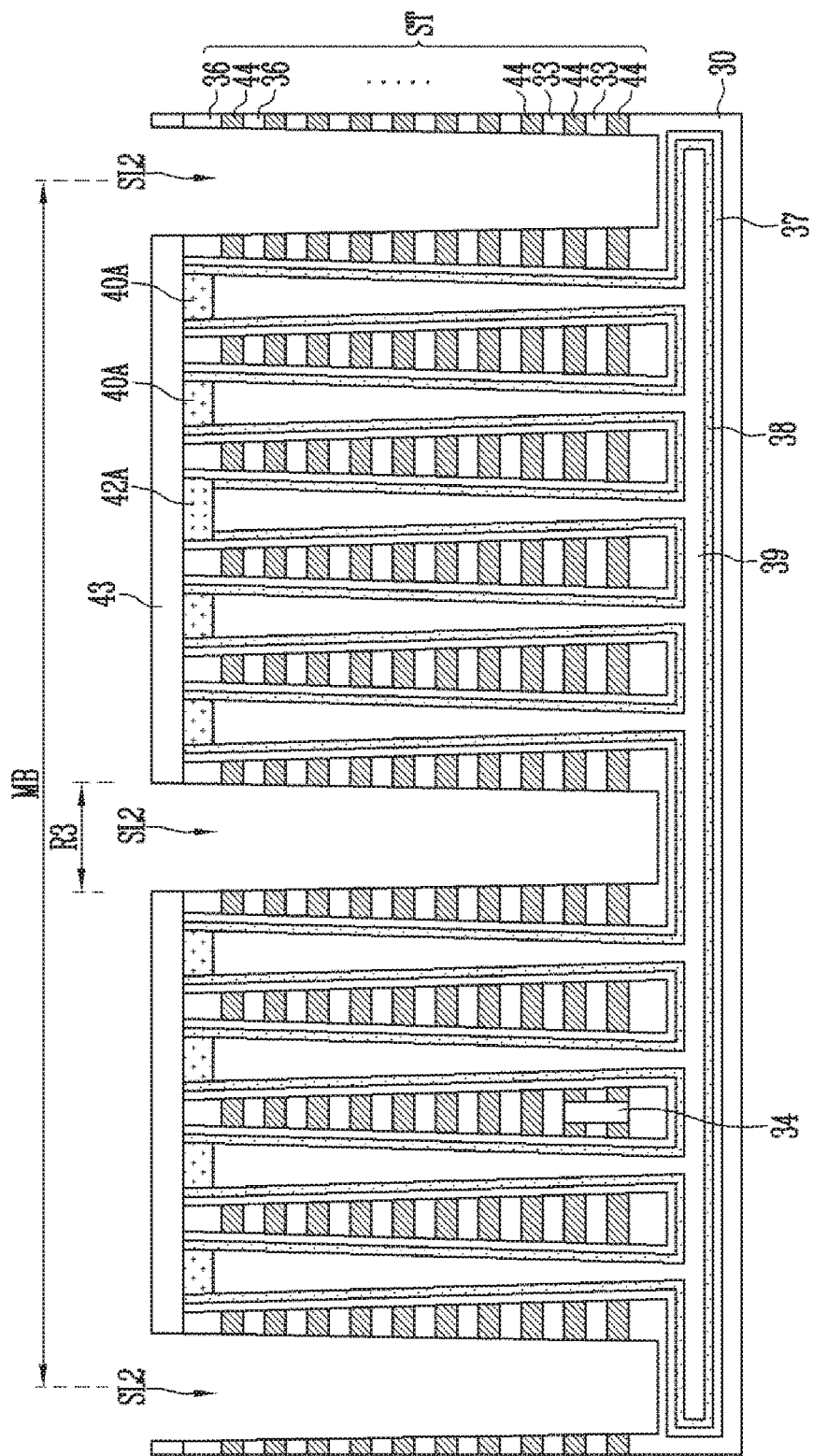

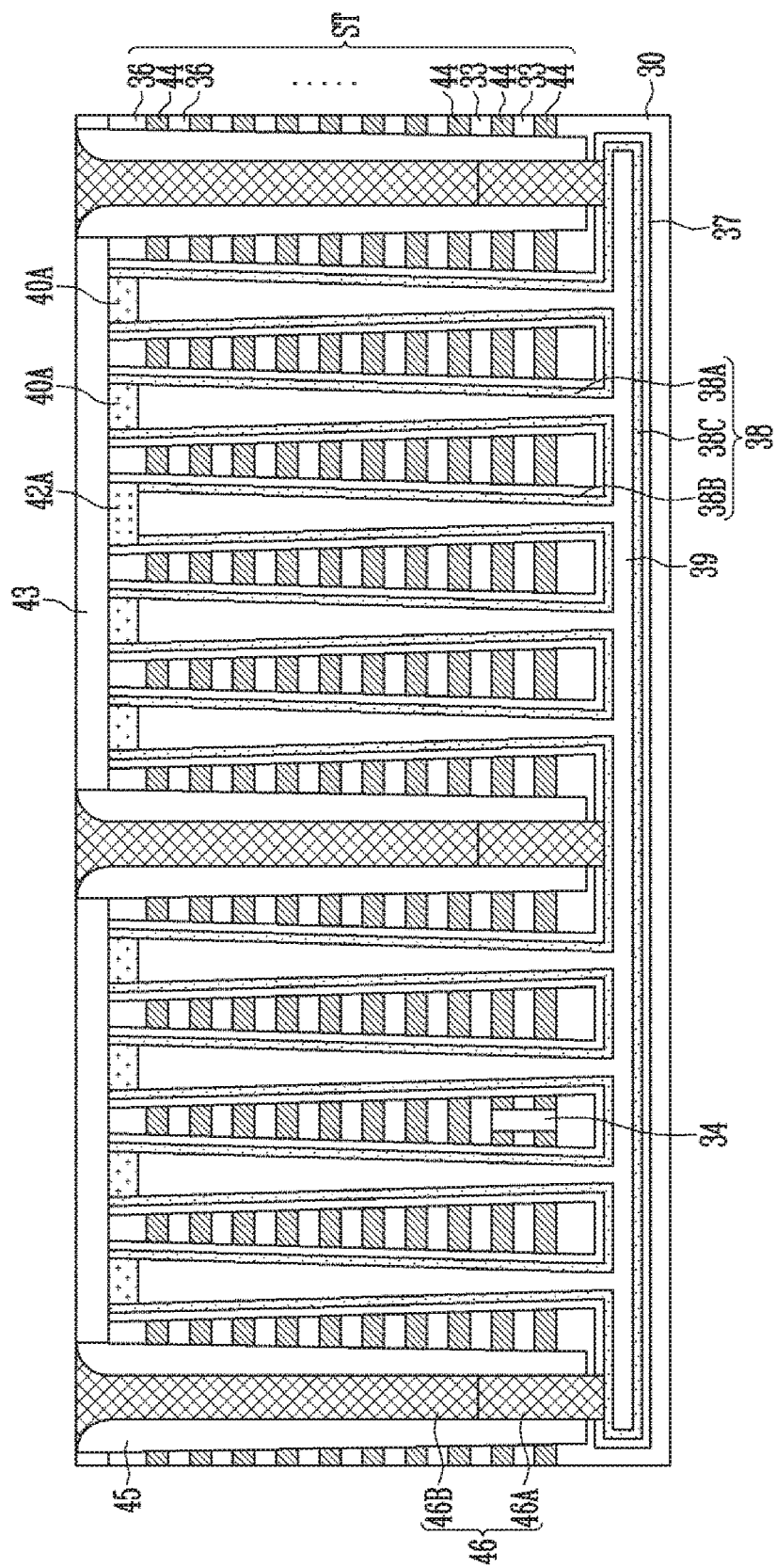

SEMICONDUCTOR DEVICE AND MANUFACTURING METHOD THEREOF

CROSS-REFERENCE TO RELATED APPLICATION

The present application claims priority under 35 U.S.C. § 119(a) to Korean patent application number 10-2018-0058184, filed on May 23, 2018, which is incorporated herein by reference in its entirety.

BACKGROUND

1. Field of Invention

The present disclosure generally relates to an electronic device and, more particularly, to a semiconductor device and a manufacturing method thereof.

2. Description of Related Art

A nonvolatile memory device retains stored data even when the supply of power to the device is cut off. Recently, as improvements in the degree of integration of two-dimensional nonvolatile memory devices in which memory cells are formed in a single layer on a substrate have reached an upper limit, three-dimensional nonvolatile memory devices are being proposed in which memory cells are vertically stacked in multiple layers on a substrate.

Typically, a three-dimensional nonvolatile memory device includes a plurality of interlayer insulating layers and gate electrodes, which are alternately stacked, and channel layers penetrating the interlayer insulating layers and the gate electrodes. Memory cells are stacked along the channel layers. Various structures and manufacturing methods have been developed for improving the operational reliability of the three-dimensional non-volatile memory device.

SUMMARY

Various embodiments of the present invention provide a semiconductor device that facilitates a manufacturing process and has a stable structure and improved characteristics, and a manufacturing method of the semiconductor device.

In accordance with an aspect of the present disclosure, there is provided a semiconductor device including: a stack structure; a source connection structure penetrating the stack structure; n first channel rows located at one side of the source connection structure, the n first channel rows including channel patterns; and n+k second channel rows located at the other side of the source connection structure, at least one channel row among the n+k second channel rows including dummy channel patterns, wherein the n and k are integers.

In accordance with another aspect of the present disclosure, there is provided a semiconductor device including: a first memory block including a first stack structure and first channel rows penetrating the first stack structure; and a second memory block including a second stack structure and second channel rows penetrating the second stack structure, wherein a number of the first channel rows is different from that of the second channel rows.

In accordance with still another aspect of the present disclosure, there is provided a method of manufacturing a semiconductor device, the method including: forming a stack structure including a first region, a second region, and a third region located between the first region and the second region; forming n first channel rows penetrating the first region of the stack structure and n+k second channel rows penetrating the second region of the stack structure; and forming a source connection structure penetrating the third region of the stack structure, wherein the n and k are integers.

In accordance with still another aspect of the present disclosure, there is provided a semiconductor device including: a stack structure; a source connection structure penetrating the stack structure; first channel rows formed in the stack structure at one side of the source connection structure, the first channel rows including channel patterns; and second channel rows formed in the stack structure at the other side of the source connection structure, the second channel rows including dummy channel patterns, wherein a number of first channel rows is less than a number of second channel rows.

BRIEF DESCRIPTION OF THE DRAWINGS

Example embodiments of the present invention will now be described more fully hereinafter with reference to the accompanying drawings; however, it should be understood that the present invention may be embodied in different other forms and should not be construed as limited only to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A to 1C are views illustrating a structure of a semiconductor device in accordance with an embodiment of the present disclosure.

FIGS. 2A and 2B are layouts illustrating a structure of a semiconductor device in accordance with an embodiment of the present disclosure.

FIGS. 3A to 3K are sectional views illustrating a manufacturing method of a semiconductor device in accordance with an embodiment of the present disclosure.

DETAILED DESCRIPTION

Figure 1A:
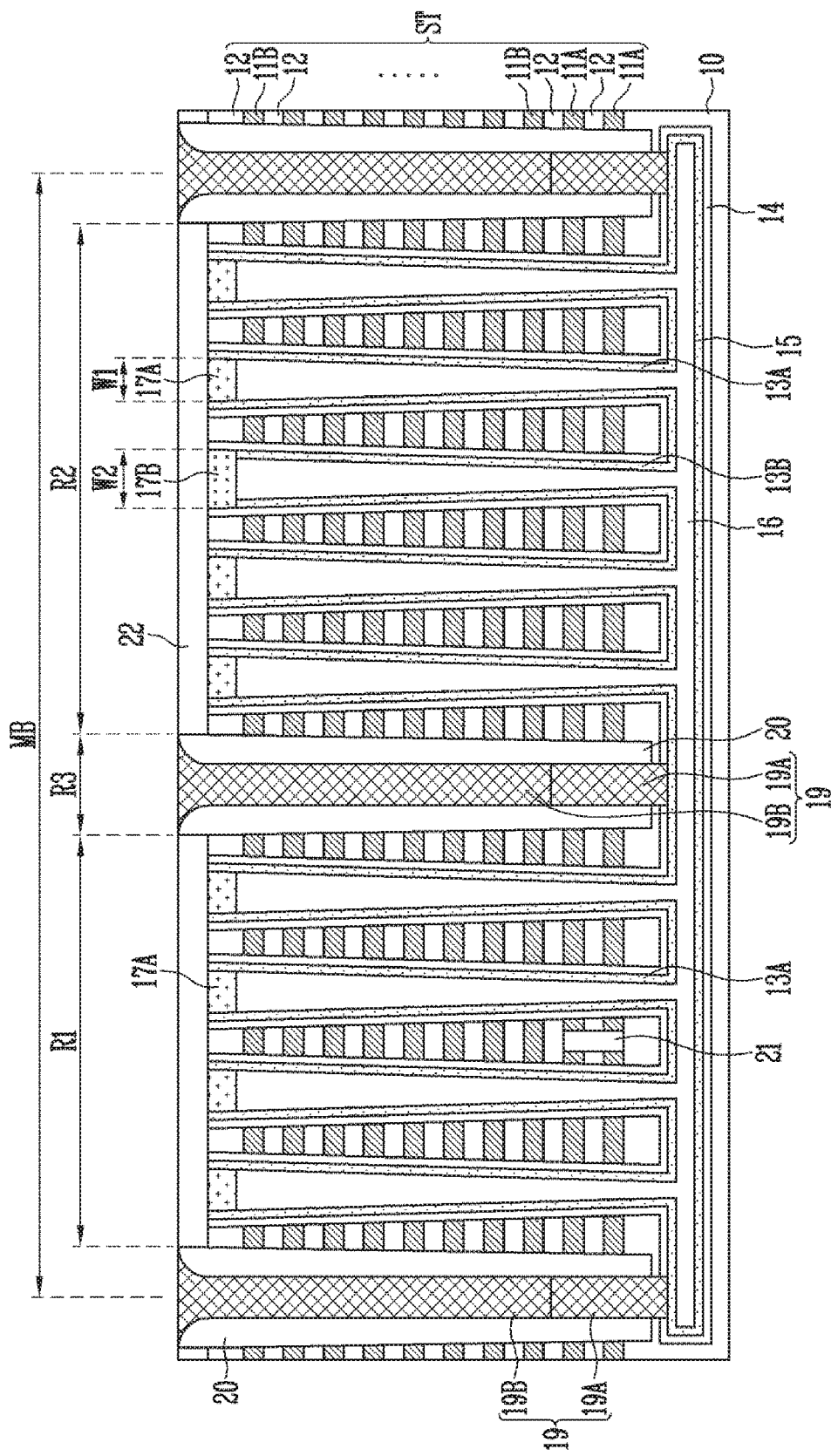

The specific structural or functional description disclosed herein is merely illustrative for the purpose of describing embodiments in accordance with the concept of the present disclosure. The embodiments in accordance with the concept of the present disclosure can be implemented in various forms, and cannot be construed as limited to the embodiments set forth herein.

The embodiments in accordance with the concept of the present disclosure can be variously modified and have various shapes. Thus, the embodiments are illustrated in the drawings and are intended to be described herein in detail. However, the embodiments in accordance with the concept of the present disclosure are not construed as limited to specified disclosures, and include all changes, equivalents, or substitutes that do not depart from the spirit and technical scope of the present disclosure.

While terms such as "first" and "second" may be used to describe various components, such components must not be understood as being limited to the above terms. The above terms are used only to distinguish one component from another. For example, a first component may be referred to as a second component without departing from the scope of rights of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately~ between" or "adjacent to ~" and "directly adjacent to ~" may be construed similarly.

The terms used in the present application are merely used to describe particular embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Figure 1B:
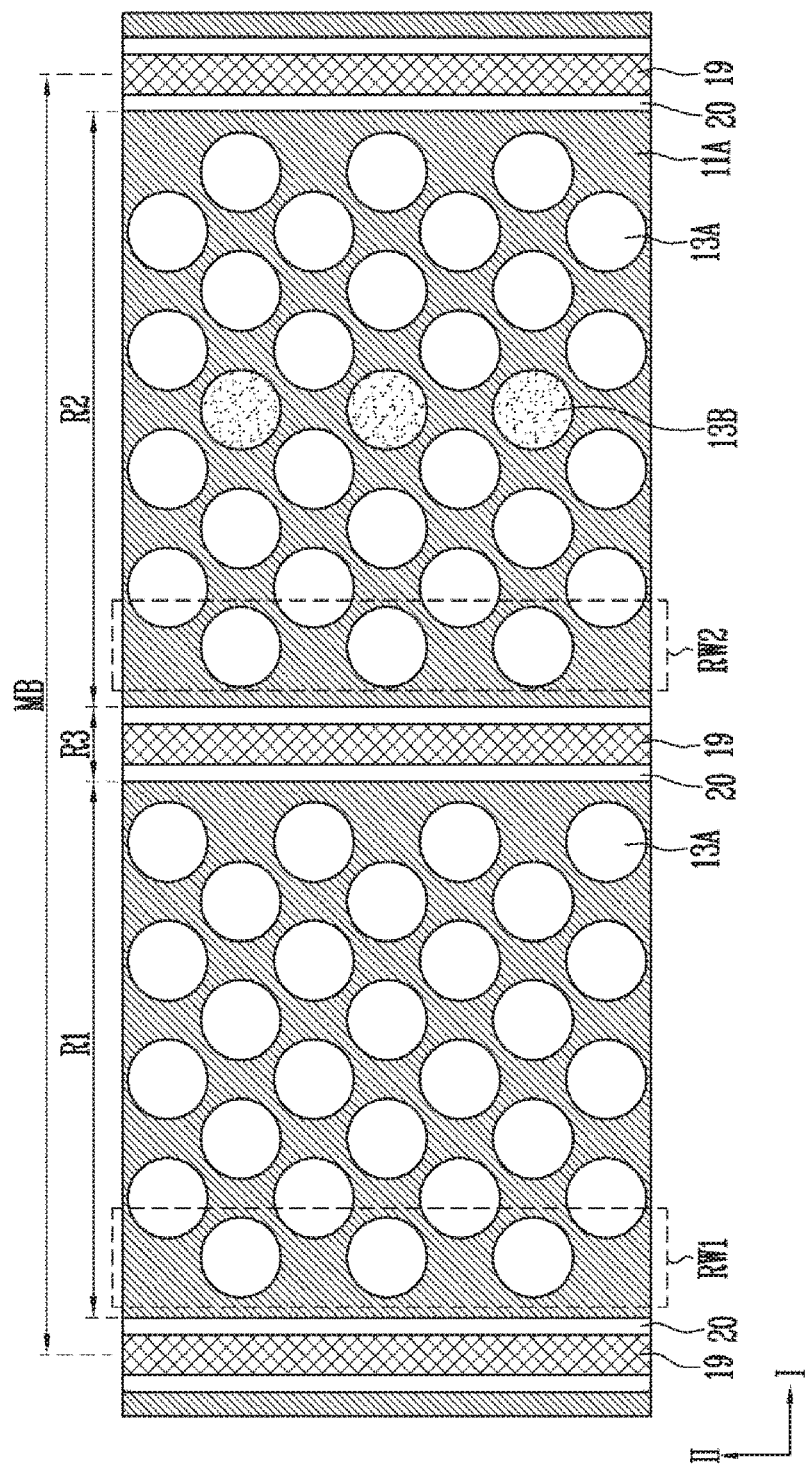

FIGS. 1A to 1C are views illustrating a structure of a semiconductor device in accordance with an embodiment of the present disclosure. FIG. 1A is a sectional view, and FIGS. 1B and 1C are layouts.

Referring to FIGS. 1A to 1C, the semiconductor device in accordance with an embodiment of the present disclosure may include a plurality of memory blocks MB. Each of the memory blocks MB may include a stack structure ST, a source connection structure 19, first channel rows RW1, and second channel rows RW2. The memory block MB may be a unit in which data is erased. Also, the semiconductor device may further include a base 10, a gap fill layer 16, first pads 17A, second pads 17B, a spacer 20, separation insulating patterns 21, and the like.

The stack structure ST includes conductive layers 11A and 11B and insulating layers 12, which are alternately stacked. Suitable materials for the conductive layers 11A and 11B may include a metal such as tungsten. Suitable materials for the conductive layers 11A and 11B may include poly-silicon. At least one lowermost conductive layer 11A may be a first select line, at least one uppermost conductive layer 11B may be a second select line, and the other conductive layers 11B may be word lines. For example, the first select line may be a source select line, and the second select line may be a drain select line.

The base 10 may be located under the stack structure ST. Suitable materials for the base 10 may include a semiconductor substrate including silicon, germanium, and the like. The base 10 may be made of or include an insulating layer. In addition, a mask pattern 22 may be located on the stack structure ST. The mask pattern 22 may not cover the source connection structure 19 and the spacer 20.

The stack structure ST may include a first region R1, a second region R2, and a third region R3 located between the first region R1 and the second region R2. For example, the first region R1 may be located at one side of the third region R3, and the second region R2 may be located at the other side of the third region R3. The first region R1, the third region R3, and the second region R2 may be sequentially arranged along a first direction I. The first region R1 and the second region R2 may have the same width or different widths. For example, as illustrated in FIG. 1A, the second region R2 may have a width wider than that of the first region R1.

The first channel rows RW1 may be located in the first region R1, and the second channel rows RW2 may be located in the second region R2. Each of the first channel rows RW1 may include channel patterns 13A arranged in a second direction II. Each of the second channel rows RW2 may include channel patterns 13A arranged in the second direction II, or include dummy channel patterns 13B arranged in the second direction II. As illustrated in FIG. 1B, some of the second channel rows RW2 may include channel patterns 13A arranged in the second direction while at least one of the second channel rows RW2 may include dummy channel patterns 13B arranged in the second direction. The first and second channel rows RW1 and RW2 may be arranged sequentially along the first direction I, and may each extend along the second direction II intersecting the first direction I. The second direction II may be intersecting the first direction I perpendicularly, however, the invention is not limited in this way.

The number of first channel rows RW1 included in one memory block MB and the number of second channel rows RW2 included in the one memory block MB may be equal. The number of first channel rows RW1 included in one memory block MB and the number of second channel rows RW2 included in the one memory block MB may be different from each other. In the illustrated embodiment the number of second channel rows RW2 may be larger than that of first channel rows RW1. For example, one memory block MB may include n first channel rows RW1 and n+k second channel rows RW2. The n and k may be integers of 1 or more. In addition, n second channel rows RW2 among the second channel rows RW2 may include channel patterns 13A, and k second channel rows RW2 among the second channel rows RW2 may include dummy channel patterns 13B. For example, in the illustrated embodiment of FIG. 1B, n=8 and k=1, hence, one memory block MB may include eight first channel rows RW1 and nine second channel rows RW2. In addition, the second channel rows RW2 including channel patterns 13A may be symmetrically arranged at both sides of a second channel row RW2 including dummy channel patterns 13B. For example, as illustrated in FIG. 1B, the fifth second channel row RW2 among the second channel rows RW2 may include dummy channel patterns 13B.

Each of the channel patterns 13A and the dummy channel patterns 13B may be a semiconductor pillar penetrating the stack structure ST. Also, the channel patterns 13A and the dummy channel patterns 13B may be connected to each other by a connection pattern 15. For example, channel patterns 13A, dummy channel patterns 13B, and the connection pattern 15, which are included in one memory block MB, may be one semiconductor layer. The connection pattern 15 may be formed in the base 10 under the stack structure ST.

The gap fill layer 16 may be filled in the channel patterns 13A, the dummy channel patterns 13B, and the connection pattern 15. An insulating material such as an oxide may be used to form the gap fill layer 16. In addition, a memory layer 14 may be formed to surround outer surfaces of the channel patterns 13A, the dummy channel patterns 13B, and the connection pattern 15. The memory layer 14 may include at least one of a tunnel insulating layer, a data storage layer, and a charge blocking layer. For example, the data storage layer may include a floating gate, a charge trap material, silicon, a nitride, a variable resistance material, a phase change material, nano dots, and the like.

The first pads 17A may be located on the channel patterns 13A, and the second pads 17B may be located on the dummy channel patterns 13B. The first pads 17A and the second pads 17B may include impurities of different type. For example, the first pads 17A may include an N-type impurity, and the second pads 17B may include a P-type impurity.

The first pads 17A and the second pads 17B may have the same width. However, in a modified embodiment, the first pads 17A and the second pads 17B may have different widths W1 and W2 as illustrated in FIG. 1A. For example, the first pads 17A may be in contact with inner surfaces of the channel patterns 13A and have the relatively narrow width W1 compared to the width W2 of the second pads 17B. The second pads 17B may be in contact with upper surfaces of the dummy channel patterns 13B and have the relatively wide width W2 compared to the first pads 17A. Therefore, in a modified embodiment, the dummy channel patterns 13B may have a height lower than that of the channel patterns 13A. For example, the upper surfaces of the dummy channel patterns 13B may be located at substantially the same level as the gap fill layer 16, and upper surfaces of the channel patterns 13A may be located higher than that of the gap fill layer 16.

The first pads 17A may be used to connect the channel patterns 13A and lines. For example, the channel patterns 13A may be connected to bit lines through the first pads 17A. The second pads 17B may be used to connect the dummy channel patterns 13B and lines. For example, the dummy channel patterns 13B may be connected to well lines through the second pads 17B. In an erase operation, an erase bias may be applied to the dummy channel patterns 13B through the second pads 17B. That is, the dummy channel patterns 13B and the second pads 17B may be used as a well connection structure.

The separation insulating patterns 21 are used to pattern the conductive layers 11A and 11B, and may penetrate at least a portion of the stack structure ST. For example, the separation insulating patterns 21 may be made of an insulating material including, for example, an oxide. The separation insulating patterns 21 may separate the conductive layers 11A and 11B located at the same level from each other. Therefore, some conductive layers 11A included in the stack structure ST may be patterned with a width narrower than that of the conductive layers 11B included in the stack structure.

In an example, the separation insulating pattern 21 located in the first region R1 is located between the first channel rows RW1. The channel patterns 13A may have a tapered section of which width decreases when approaching a lower portion thereof. While the distance between adjacent channel patterns 13A is narrow at an upper portion of the stack structure ST, the distance between adjacent channel patterns 13A is wide at a lower portion of the stack structure ST. Therefore, the separation insulating pattern 21 may be located between adjacent channel patterns 13A at a lower portion of the stack structure ST so that the conductive layers 13A at the same level are separated from each other by the separation insulating pattern 21.

In the illustrated embodiment of FIG. 1C, a separation insulating pattern 21 may be located in the second region R2 and may overlap with one of the second channel rows RW2 including the dummy channel patterns 13B. In the second direction II, the separation insulating pattern 21 may be divided into sections which are located between dummy channel patterns 13B. Therefore, the at least one conductive layer 11A may be separated by the dummy channel patterns 13B and the separation insulating patterns 21.

Accordingly, at least one lowermost conductive layer 11A may be patterned with a width narrower than that of the other conductive layers 11B. For example, at least one lowermost conductive layer 11A may be a source select line, some of the conductive layers 11A may be word lines, and the source select lines may be patterned with a width narrower than that of word lines. Therefore, memory strings may be individually controlled. For example, although the connection between the memory strings and the bits lines is controlled by a common drain select line, the connection between the memory strings and a source line may be individually controlled by the source select lines.

The source connection structure 19 is used to connect the channel patterns 13A and a source line (not shown), and penetrates the third region R3 of the stack structure ST. For example, the source connection structure 19 may be located at the center of the memory block MB, the first channel rows RW1 may be located at one side of the source connection structure 19, and the second channel rows RW2 may be located at the other side of the source connection structure 19. In an example, when the number of first channel rows RW1 is equal to that of second channel rows RW2, the first channel rows RW1 and the second channel rows RW2 are symmetrically arranged at both sides of the source connection structure 19. In another example, when the number of first channel rows RW1 is different from that of second channel rows RW2, the first channel rows RW1 and the second channel rows RW2 are asymmetrically arranged at both sides of the source connection structure 19.

The source connection structures 19 may be located between adjacent memory blocks MB. Therefore, adjacent memory blocks MB may share the source connection structure 19.

The source connection structures 19 may be connected to the first and second channel rows RW1 and RW2. For example, the source connection structures 19 may be connected to the channel patterns 13A through the connection pattern 15. Therefore, in a read operation, a current path may be formed from the channel patterns 13A to the source connection structure 19 through the connection pattern 15.

The source connection structures 19 may have a shape of lines extending in the second direction II, or have a shape of plugs. When the source connection structures 19 have a shape of plugs, the source connection structures 19 may be arranged at a predetermined distance along the second direction II.

The source connection structure 19 may include a first conductive pattern 19A and a second conductive pattern 19B. The first conductive pattern 19A penetrates the memory layer 14 and is connected to the connection pattern 15. The second conductive pattern 19B is connected to the first conductive pattern 19A. The second conductive pattern 19B may include a material having a resistance lower than that of the first conductive pattern 19A. For example, the first conductive pattern 19A may include poly-silicon, and the second conductive pattern 19B may include a metal such as tungsten.

The spacer 20 may be formed on a sidewall of the source connection structure 19. The spacer 20 may include an insulating material such as oxide, and insulate the conductive layers 11A and 11B and the source contact structure 19 from each other.

According to the structure described above, the first and second channel rows RW1 and RW2 are asymmetrically arranged at both sides of the source connection structure 19 in one memory block MB. In addition, some second channel rows RW2 among the second channel rows RW2 include the dummy channel patterns 13B, and an erase bias is applied through the dummy channel patterns 13B. Thus, the well connection structure can be implemented using the dummy channel patterns 13B.

Further, the dummy channel patterns 13B are located at only the other side of the source connection structure 19, so that one side of the source connection structure can have a width narrower than that of the other side of the source connection structure 19. Thus, the area occupied by one memory block MB can be decreased, and accordingly, the degree of integration of a memory device can be improved.

Figure 2B:
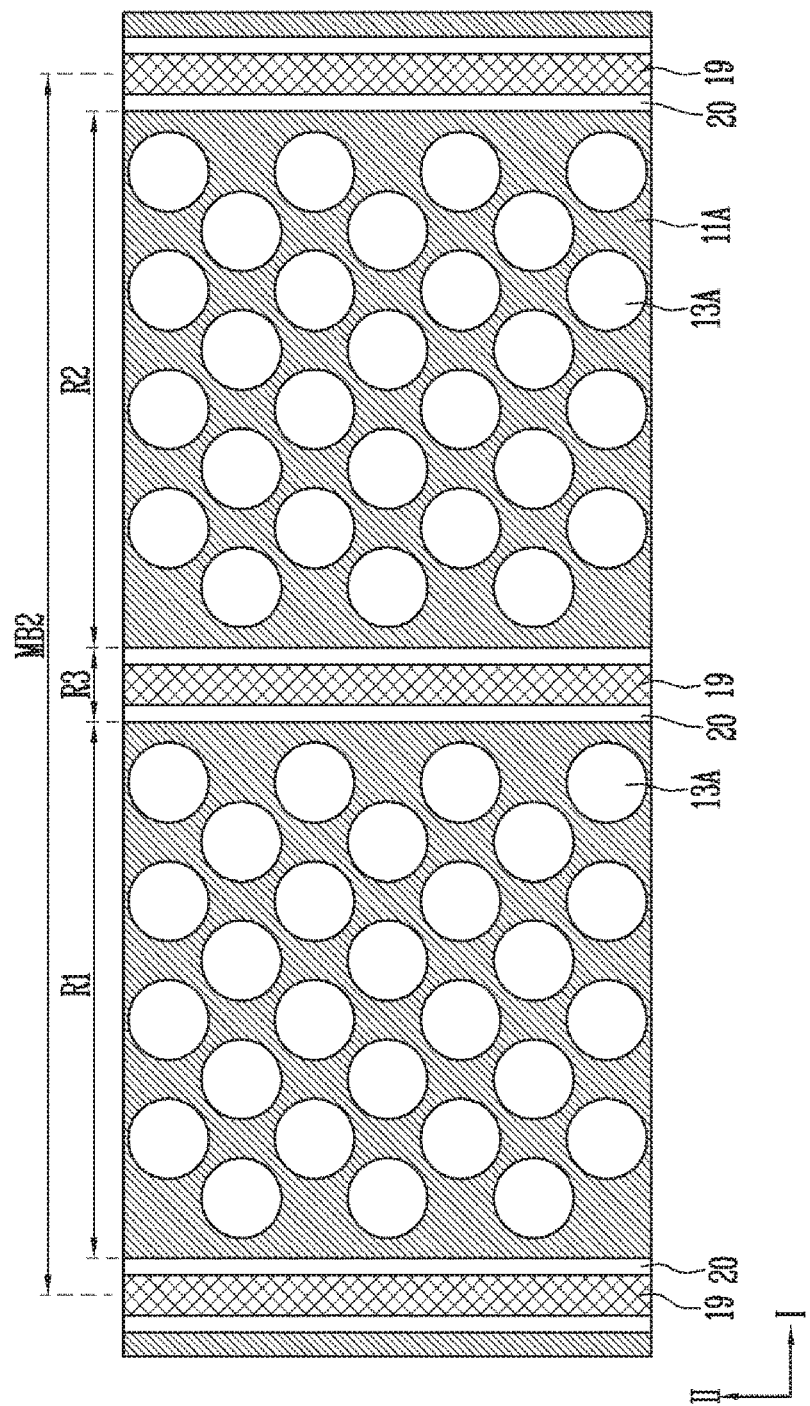

FIGS. 2A and 2B are layouts illustrating a structure of a semiconductor device in accordance with an embodiment of the present disclosure. FIG. 2A illustrates a layout of a first memory block, and FIG. 2B illustrates a layout of a second memory block.

The semiconductor device in accordance with an embodiment of the present disclosure may include a plurality of memory blocks, and the plurality of memory blocks may include different numbers of channel rows. For example, the plurality of memory blocks may include a first memory block and a second memory block, and the number of channel rows included in the first memory block may be different from that of channel rows included in the second memory block.

Referring to FIG. 2A, the first memory block MB1 may include n first channel rows RW1 located at one side of a source connection structure 19 and n+k second channel rows RW2 located at the other side of the source connection structure 19. Therefore, in the first memory block MB1, the first and second channel rows RW1 and RW2 may be asymmetrically arranged at both sides of the source connection structure 19.

Referring to FIG. 2B, the second memory block MB2 may include n first channel rows RW1 located at one side of a source connection structure 19 and n second channel rows RW2 located at the other side of the source connection structure 19. Therefore, the first memory block MB1, the first and second channel rows RW1 and RW2 may be symmetrically arranged at both sides of the source connection structure 19.

According to this structure, the second memory block MB2 has an area narrower than that of the first memory block MB1. Thus, the semiconductor device includes both of the first and second memory blocks MB1 and MB2 having different types, so that the degree of integration of the semiconductor device can be improved as compared with a semiconductor device including only the first memory block MB1. For example, the semiconductor device may include second memory blocks MB2 at a ratio of 10% to 50% among all memory blocks.

FIGS. 3A to 3K are sectional views illustrating a manufacturing method of a semiconductor device in accordance with an embodiment of the present disclosure. Hereinafter, descriptions of contents overlapping with those of the above-described embodiment will not be repeated.

Referring to FIG. 3A, a sacrificial layer 31 is formed in a base 30. For example, a trench T is formed in a first base 30A, and the sacrificial layer 31 is then formed in the trench T. Subsequently, a second base 30B is formed on the first base 30A. Accordingly, the base 30 including the sacrificial layer 31 is formed. The base 30 may be a substrate, and may be, for example, a semiconductor substrate. In addition, the sacrificial layer 31 may include a material having a high etch selectivity to the base 30. For example, suitable materials for the sacrificial layer 31 may include titanium nitride, and for the base 30 may include poly-silicon, an oxide such as silicon oxide, and the like.

On the other hands, one trench T may be formed in a single memory block MB, or a plurality of trenches T may be formed in the single memory block MB. When the plurality of trenches T are formed in the single memory block MB, the first base 30A remaining between the trenches T may be used as a support structure for supporting a stack structure formed in a subsequent process.

Subsequently, a first stack structure ST1 is formed over the second base 30B. The first stack structure ST1 may include at least one first material layer 32 and at least one second material layer 33. The first material layers 32 and the second material layers 33 may be alternately stacked. The first material layers 32 may be used to form gate electrodes of memory cells, select transistors, etc., and the second material layers 33 may be used to insulate the stacked gate electrodes from each other.

The first material layers 32 may include a material having a high etch selectivity to the second material layers 33. In an example, the first material layers 32 may be sacrificial layers including nitride, etc., and the second material layers 33 may be insulating layers including oxide, etc. In another example, the first material layers 32 may be conductive layers including poly-silicon, tungsten, etc., and the second material layers 33 may be insulating layers including oxide, etc. In still another example, the first material layers 32 may be conductive layers including doped poly-silicon, etc., and the second material layers 33 may be sacrificial layers including undoped poly-silicon, etc.

Referring to FIG. 3B, separation insulating patterns 34 penetrating through the first stack structure ST1 to expose the second base 30B are formed. For example, the separation insulating patterns 34 may have a shape of lines extending in one direction, such as the separation insulating patterns 21 extending in the second direction II shown in FIG. 1C. Thus, the first stack structure ST1 is separated into a plurality of patterns by the separation insulating patterns 34.

For example, a mask pattern is formed on the stack structure ST1, and first slits SL1 are then formed by etching the first stack structure ST1, using the mask pattern as an etch barrier. The first slits SL1 may be formed to a depth where it penetrates all of the first material layers 32 included in the first stack structure ST1. The first slits SL1 may expose the surface of the second base 30. Subsequently, the separation insulating patterns 34 are formed in the first slits SL1. The separation insulating patterns 34 may include an insulating material such as an insulating oxide material, for instance silicon dioxide.

Referring to FIG. 3C, a second stack structure ST2 is formed on the first stack structure ST1. The second stack structure ST2 may include at least one third material layer 35 and at least one fourth material layer 36. The third material layers 35 and the fourth material layers 36 may be alternately stacked. The third material layers 35 may be used to form gate electrodes of memory cells, select transistors, etc., and the fourth material layers 36 may be used to insulate the stacked gate electrodes from each other.

The third material layers 35 may include a material having a high etch selectivity to the fourth material layers 36. In an example, the third material layers 35 may be sacrificial layers including nitride, etc., and the fourth material layers 36 may be insulating layers including an oxide, etc. In another example, the third material layers 35 may be conductive layers including poly-silicon, tungsten, and the like, and the fourth material layers 36 may be insulating layers including oxide, and the like. In still another example, the third material layers 35 may be conductive layers formed of a conductive material including, for example, doped poly-silicon, etc., and the fourth material layers 36 may be sacrificial layers including undoped poly-silicon, etc. The third material layer 35 may be formed of the same material as the first material layers 32, and the fourth material layers 36 may be formed of the same material as the second material layers 33.

Accordingly, a stack structure ST is formed. As described above, the first stack structure ST1 and the second stack structure ST2 are separately formed, so that the stack layers included in each of the stack structure ST can have different widths. For example, the first and second material layers 32 and 33 may have widths narrower than those of the third and fourth material layers 35 and 36. The first material layers 32 may be used to form a source select line, and the third material layers 35 may be used to form word lines or drain select lines.

Figure 3D:
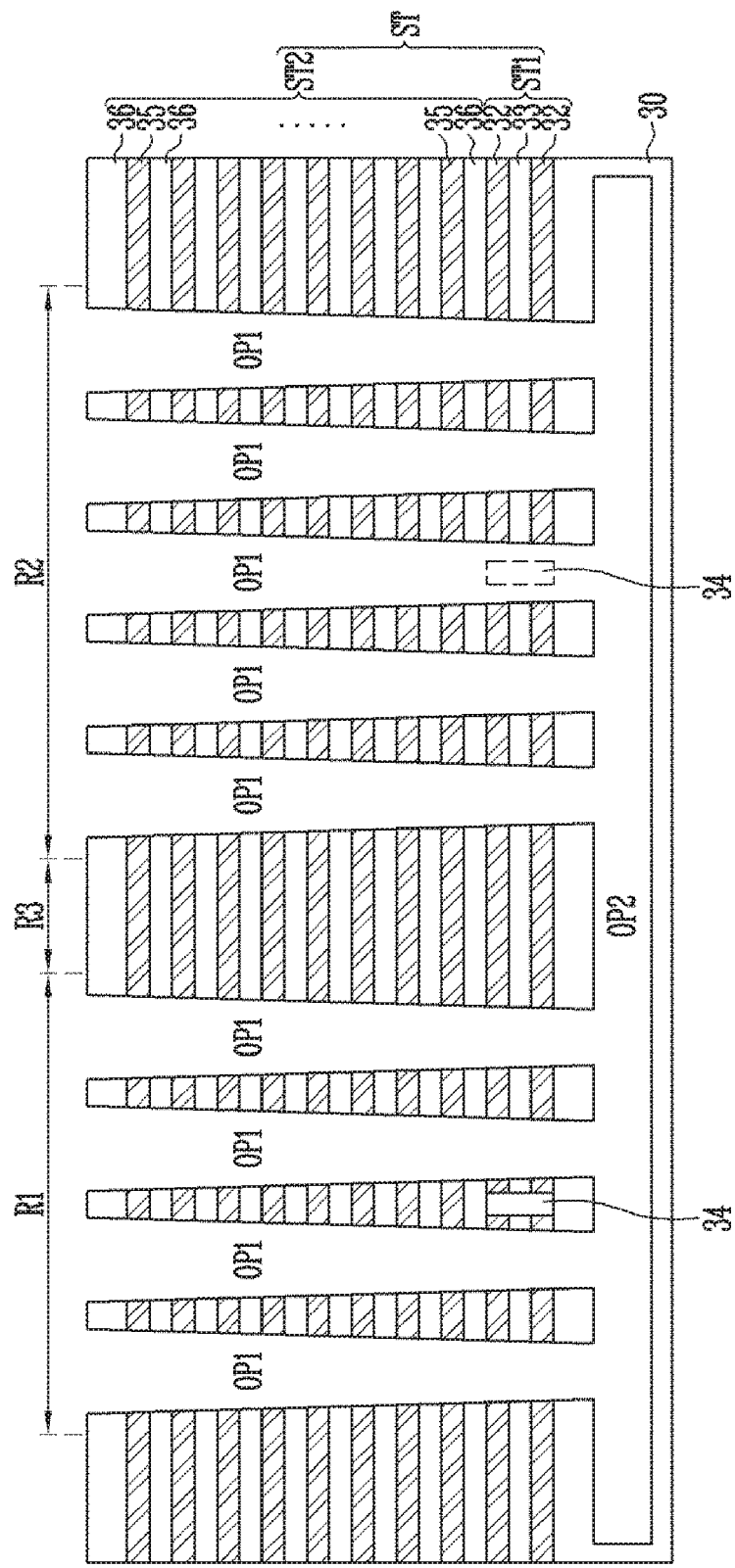

Referring to FIG. 3D, first openings OP1 penetrating the stack structure ST are formed. The first openings OP1 may be located in the first region R1 and the second region R2 but not in the third region R3. The first openings OP1 may be formed to a depth where they expose the sacrificial layer 31. In addition, some of the first openings OP1 formed in the second region R2 may overlap with the separation insulating pattern 34. In the following processes, dummy channel patterns will be formed in some of the first openings OP1.

In the second region R2, a larger number of first openings OP1 may be formed as compared with the first region R1. For example, n first opening rows may be formed in the first region R1, and n+k first opening rows may be formed in the second region R2.

Subsequently, the sacrificial layer 31 is removed through the first openings OP1. Accordingly, a second opening OP2 is formed. In addition, the first openings OP1 and the second opening OP2 are integrally connected. The first base remaining between the first openings OP1 may support the stack structure ST.

Figure 3E:
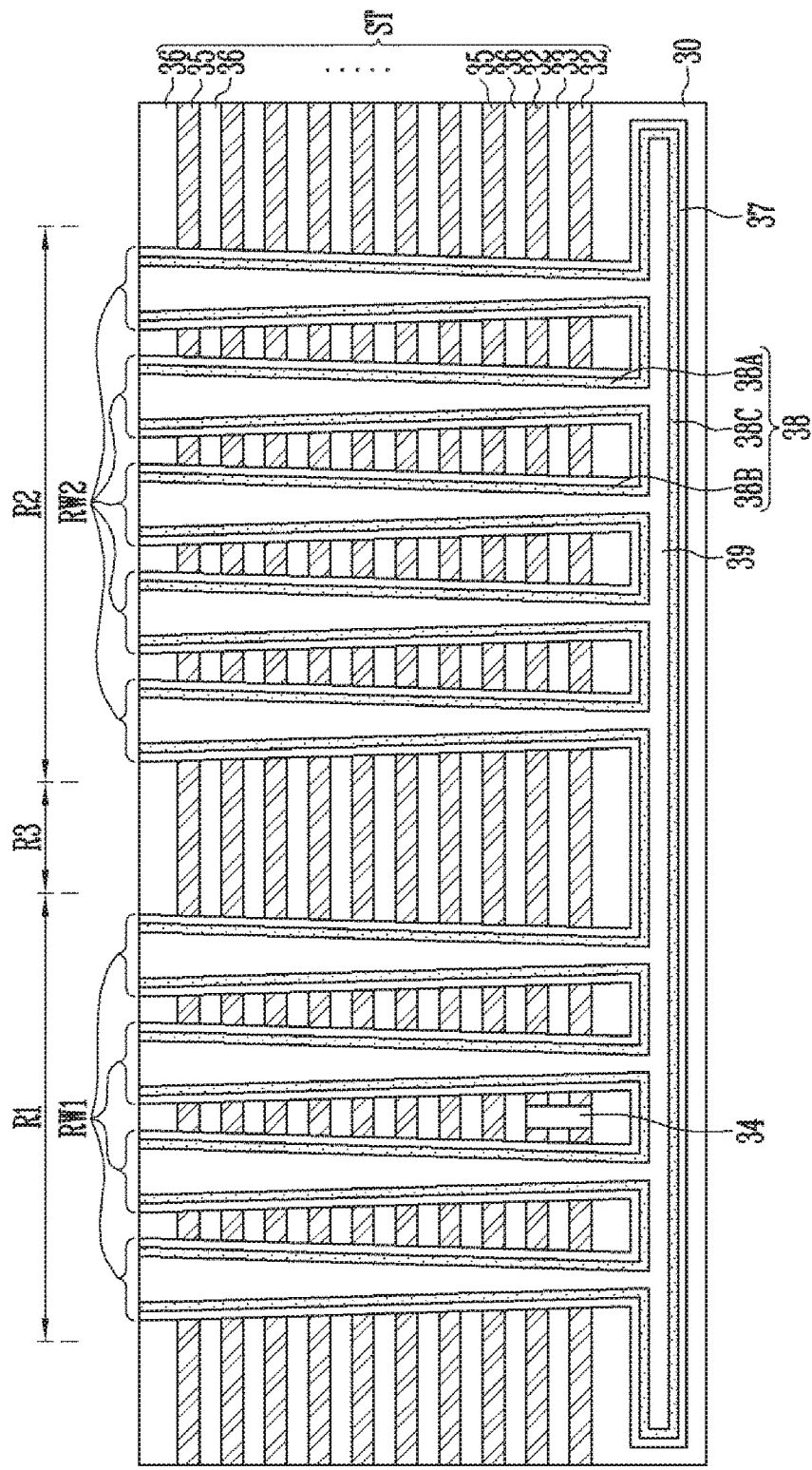

Referring to FIG. 3E, first channel rows RW1 penetrating the first region R1 of the stack structure and second channel rows RW2 penetrating the second region R2 of the stack structure ST are formed. For example, channel patterns 38A are formed in the first openings OP1 of the first region R1, and channel patterns 38A and dummy channel patterns 38B are formed in the first openings OP1 of the second region R2. In addition, a connection pattern 38C for connecting the channel patterns 38A and the dummy channel patterns 38B to each other is formed in the second opening OP2.

The channel patterns 38A, the dummy channel patterns 38B, and the connection pattern 38C may be formed as a single layer. For example, a memory layer 37 may be formed conformally on the internal wall of the first and second openings OP1 and OP2, and a semiconductor layer 38 is then formed conformally on the memory layer 37. Subsequently, a gap fill layer 39 is formed on the semiconductor layer 38 to fill the first and second openings OP1 and 0P2. The memory layer 37 may include at least one of a charge blocking layer, a data storage layer, and a tunnel insulating layer. The semiconductor layer 38 may include a semiconductor material such as silicon or germanium. The gap fill layer 39 may include an insulating material such as oxide, for instance silicon oxide, and polysilazane (PSZ). Regions of the semiconductor layer 38, which are formed in the first openings OP1 of the first region R1, constitute the first channel rows RW1. Regions of the semiconductor layer 38, which are formed in the openings OP1 of the second region R2, constitute the second channel rows RW2.

Figure 3F:
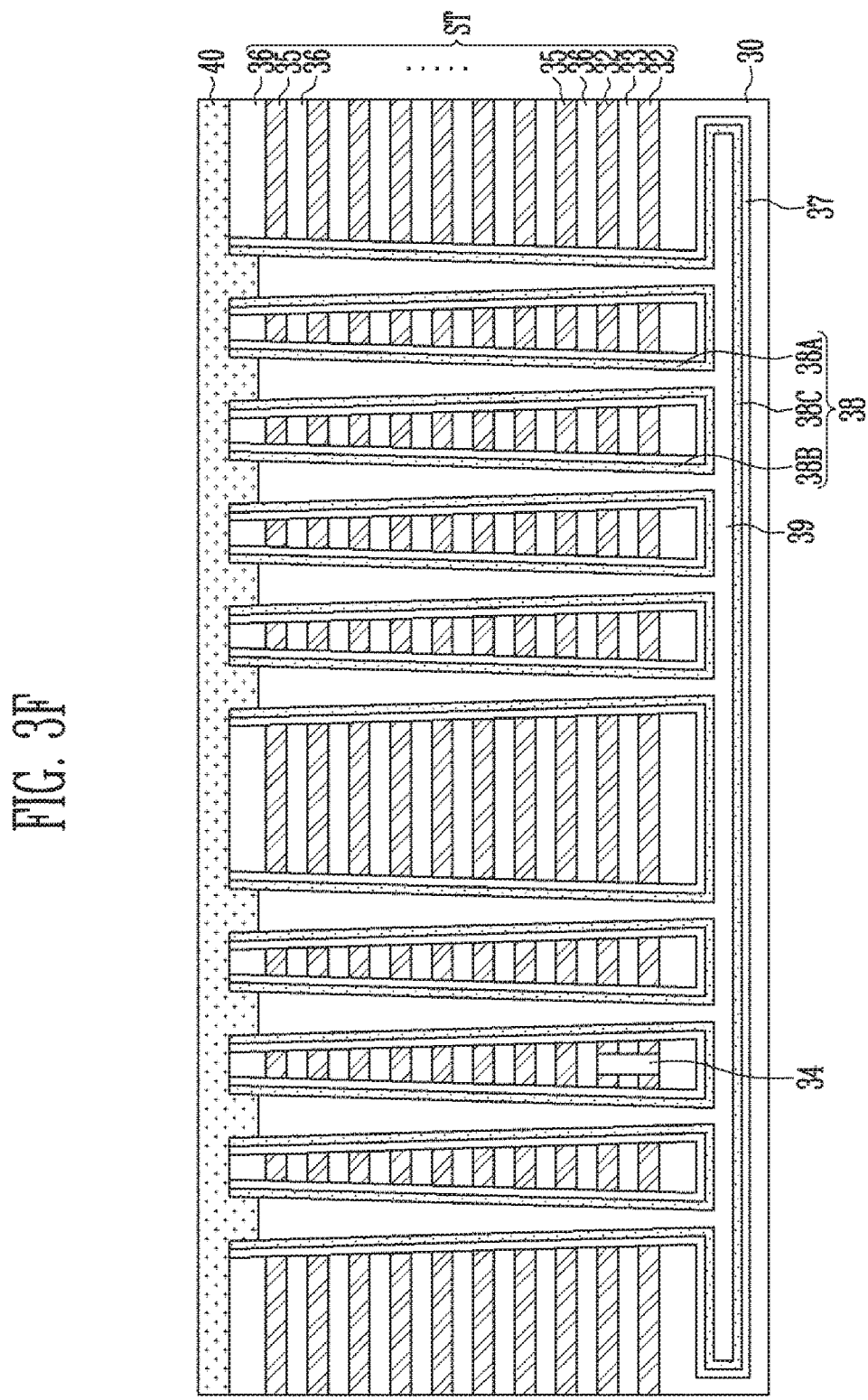

Referring to FIG. 3F, respective top regions of the first openings OP1 are re-opened by partially removing via etching the gap fill layer 39. Subsequently, a first conductive layer 40 is formed on the stack structure ST to fill in the re-opened top regions of the first openings OP1 and form a layer over the stack structure ST. The first conductive layer 40 may be made of a conductive material and may include an impurity of a first type. For example, in an embodiment, the first conductive layer 40 may be a poly-silicon layer including an N-type impurity.

Referring to FIG. 3G, regions of the first conductive layer 40, which are located on the dummy channel patterns 38B, are selectively removed. For example, a mask pattern 41 including openings that expose the regions in which the dummy channel patterns 38 are located is formed on the first conductive layer 40. Subsequently, the first conductive layer 40 is etched using the mask pattern 41 as an etch barrier. The dummy channel patterns 38B may be simultaneously etched in the process of etching the first conductive layer 40. Accordingly, some regions of the first openings OP1, in which the dummy channel patterns 38B are located, are re-opened.

Figure 3H:
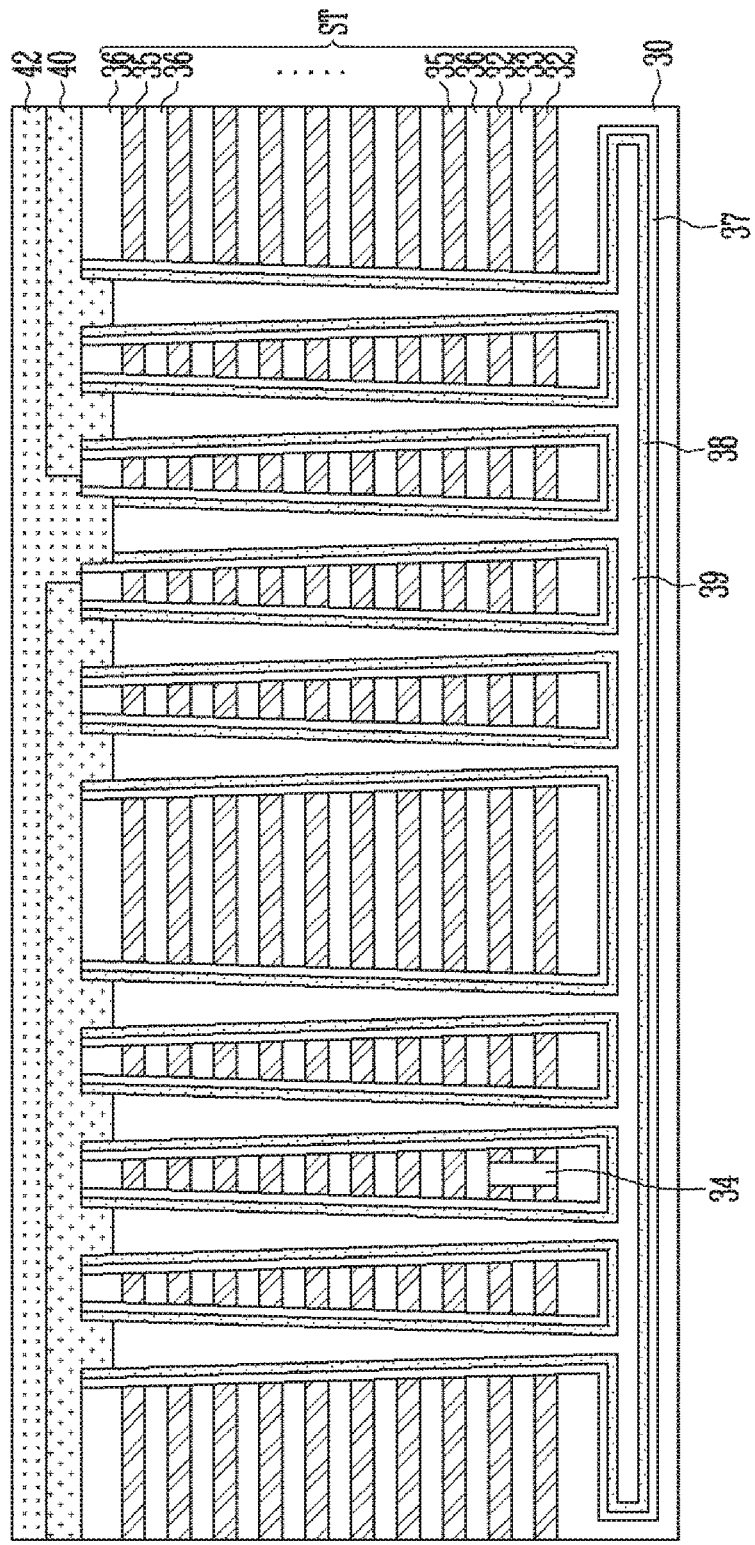

Referring to FIG. 3H, the mask pattern 41 is removed, and a second conductive layer 42 is then formed. The second conductive layer 42 may be made of a conductive material and may include an impurity of a second type different from the first type. For example, in an embodiment, the second conductive layer 42 may be a poly-silicon layer including a P-type impurity.

Referring to FIG. 3I, first pads 40A and second pads 42A are formed by planarizing the first and second conductive layers 40 and 42 until a surface of the stack structure ST is exposed. The first pads 40A may be located on the gap fill layer 39, and be in contact with inner surfaces of the channel patterns 38A. The second pads 42A may be located on the gap fill layer 39 and the dummy channel patterns 38B, and be in contact with upper surfaces of the dummy channel patterns 38B. In an embodiment, the second pads 42A may have the width W2 wider than the width W1 of the first pads 40A.

In an embodiment, the first and second pads 40A and 42A may be formed using only the first conductive layer 40. For example, after the first and second pads 40A and 42A are formed by planarizing the first conductive layer 40 of FIG. 3F, the second pads 42A may be selectively doped with the impurity of the second type.

Referring to FIG. 3J, second slits SL2 penetrating the stack structure ST are formed. For example, after a mask pattern 43 is formed on the stack structure ST, the second slits SL2 are formed by etching the stack structure ST, using the mask pattern 43 as an etch barrier.

The second slits SL2 may be located in the third region R3. The second slits SL2 may be located at a boundary between adjacent memory blocks MB. The second slits SL2 may have a shape of lines extending in one direction, or have a shape of plugs and may be arranged at a predetermined distance from one another. Also, the second slits SL2 may be formed to a depth where they expose the first and third material layers 32 and 35 included in the stack structure ST. The second slits SL2 may partially penetrate the base 30, but they do not expose the connection pattern 38C and the memory layer 37 surrounding the connection pattern 38.

Subsequently, an additional process may be performed according to the material constituting the first and third material layers 32 and 35. In an example, when the first to third material layers 32 and 35 are sacrificial layers and the second and fourth material layers 33 and 36 are insulating layers, the first to third material layers 32 and 35 are replaced with conductive layers 44. Before the conductive layers 44 are formed, a memory layer may be additionally formed in regions in which the first and third materials 32 and 35 are removed. In another example, when the first to third material layers 32 and 35 are conductive layers and the second and fourth material layers 33 and 36 are insulating layers, a siliciding process may be performed. In still another example, when the first to third material layers 32 and 35 are conductive layers and the second and fourth material layers 33 and 36 are sacrificial layers, the second and fourth material layers 33 and 36 may be replaced with insulating layers.

Referring to FIG. 3K, spacers 45 are formed in the second slits SL2. The spacers 45 may be formed of an insulating material, for instance, an oxide. Subsequently, the memory layer 37 is exposed by etching the base 30 exposed through the second slits SL2, and the memory layer 37 is then etched. Accordingly, the connection pattern 38C is exposed.

Subsequently, source connection structures 46 are formed in the second slits SL2. The source connection structure 46 may be directly connected to the connection pattern 38C. Also, the source connection structure 46 may include first conductive patterns 46A filled in lower regions of the second slits SL2 and second conductive patterns 46B filled in upper regions of the second slits SL2. The second conductive patterns 46B may include a material having a resistance lower than that of the first conductive patterns 46A. For example, a suitable material for the first conductive patterns 46A may include poly-silicon, and for the second conductive patterns 46B may include a metal.

The first and second conductive patterns 46A and 46B may be formed using a suitable method, including, for example, a deposition method, a selective growth method, and the like. For example, the first conductive patterns 46A may be formed by depositing a poly-silicon layer, using a deposition process, and then performing an etch-back process. Alternatively, the first conductive patterns 46A may be formed by allowing a poly-silicon layer to be grown from the connection pattern 38C, using a selective growth process. In addition, the second conductive patterns 46B may be formed by depositing a metal layer including, for example, tungsten, and the like and then performing a planarization process until a surface of the mask pattern 43 is exposed.

Subsequently, although not shown in the drawing, lines connected to the channel patterns 38A and the dummy channel patterns 38B may be formed. For example, bit lines connected to the channel patterns 38A, well lines connected to the dummy channel patterns 38B, and the like may be formed.

Figure 4:
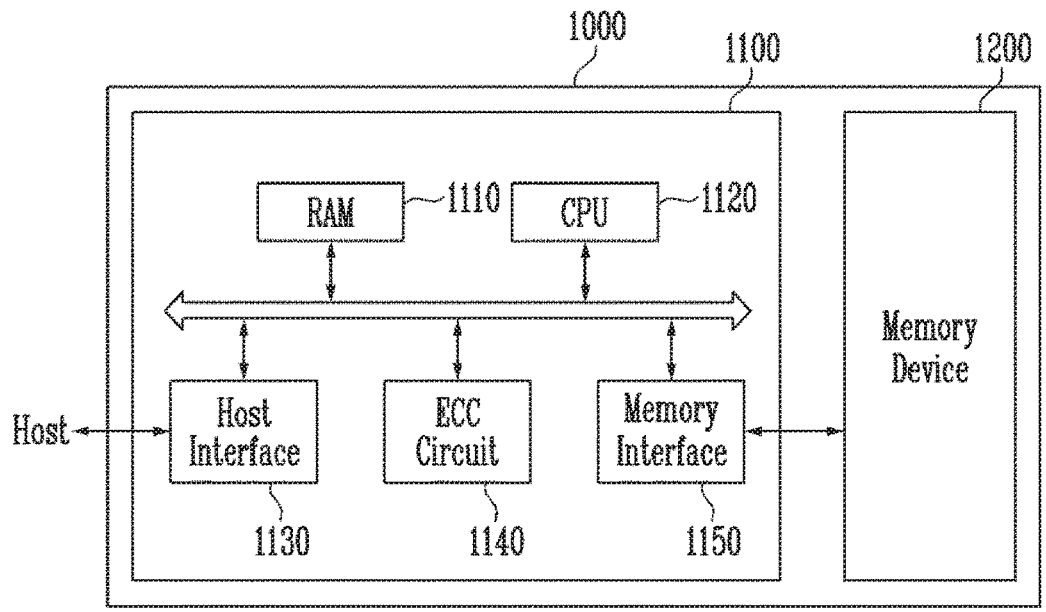
FIGS. 4 and 5 are block diagrams illustrating configurations of memory systems in accordance with embodiments of the present disclosure.

FIG. 4 is a block diagram illustrating a configuration of a memory system in accordance with an embodiment of the present disclosure.

Referring to FIG. 4, the memory system 1000 in accordance with an embodiment of the present disclosure may include a memory device 1200 and a controller 1100.

The memory device 1200 is used to store data. The data may have various data formats such as texts, graphics, and software codes. The memory device 1200 may be a nonvolatile memory. Also, the memory device 1200 may have the structures described with reference to FIGS. 1A to 3K and may be manufactured according to the manufacturing method described with reference to FIGS. 1A to 3K. In an embodiment, the memory device 1200 may include: a stack structure; a source connection structure penetrating the stack structure; n first channel rows located at one side of the source connection structure, the n first channel rows including channel patterns; and n+k second channel rows located at the other side of the source connection structure, the n+k second channel rows channel patterns or dummy channel patterns. The structure and manufacturing method of the memory device 1200 are the same as described above, and therefore, their detailed descriptions will not be repeated.

The controller 1100 is connected to a host and to the memory device 1200, and is configured to access the memory device 1200 in response to a request from the host. For example, the controller 1100 is configured to control reading, writing, erasing, and background operations of the memory device 1200.

The controller 1100 may include a random-access memory (RAM) 1110, a central processing unit (CPU) 1120, a host interface 1130, an error correction code (ECC) circuit 1140, a memory interface 1150, and the like.

The RAM 1110 may be used as a working memory of the CPU 1120, a cache memory between the memory device 1200 and the host, and a buffer memory between the memory device 1200 and the host. For reference, the RAM 1110 may be replaced with a static random-access memory (SRAM), a read only memory (ROM), etc.

The CPU 1120 may be configured to control the operations of the controller 1100. For example, the CPU 1120 may be configured to operate firmware such as a flash translation layer (FTL) stored in the RAM 1110.

The host interface 1130 is configured to interface with the host. For example, the controller 1100 communicates with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, for example, using an error correction code (ECC).

The memory interface 1150 may be configured to interface with the memory device 1200. For example, the memory interface 1150 may include at least one of a NAND interface and a NOR interface.

The controller 1100 may further include a buffer memory (not shown) for temporarily storing data. The buffer memory may be used to temporarily store data transferred to the outside through the host interface 1130 or data transferred from the memory device 1200 through the memory interface 1150. The controller 1100 may further include a ROM that stores code data for interfacing with the host.

As described above, the memory system 1000 in accordance with an embodiment of the present disclosure includes the memory device 1200 having an improved degree of integration and improved characteristics, and thus the degree of integration and characteristics of the memory system 1000 can also be improved.

Figure 5:
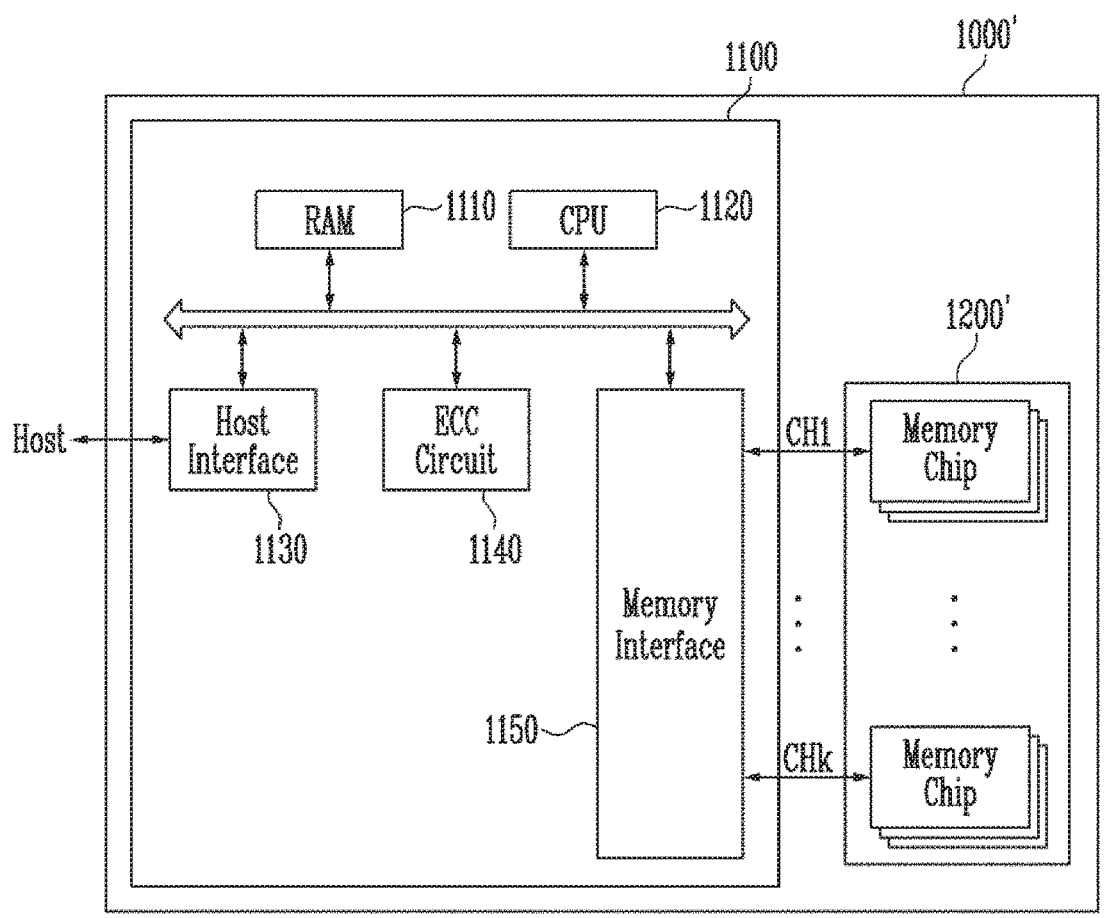

FIG. 5 is a block diagram illustrating a configuration of a memory system in accordance with an embodiment of the present disclosure. Hereinafter, descriptions of contents overlapping with those described above will not be repeated.

Referring to FIG. 5, the memory system 1000' in accordance with an embodiment of the present disclosure may include a memory device 1200' and a controller 1100. The controller 1100 may include a RAM 1110, a CPU 1120, a host interface 1130, an ECC circuit 1140, a memory interface 1150, and the like.

The memory device 1200' may be a nonvolatile memory. Also, the memory device 1200' may have the structures described with reference to FIGS. 1A to 3K and may be manufactured according to the manufacturing method described with reference to FIGS. 1A to 3K. In an embodiment, the memory device 1200' may include: a stack structure; a source connection structure penetrating the stack structure; n first channel rows located at one side of the source connection structure, the n first channel rows including channel patterns; and n+k second channel rows located at the other side of the source connection structure, the n+k second channel rows channel patterns or dummy channel patterns. The structure and manufacturing method of the memory device 1200' are the same as described above, and therefore, their detailed descriptions will not be repeated.

The memory device 1200' may be a multi-chip package including a plurality of memory chips. The plurality of memory chips may be divided into a plurality of groups which are configured to communicate with the controller 1100 over first to kth channels (CH1 to CHk). In addition, memory chips included in one group may be configured to communicate with the controller 1100 over a common channel. For reference, the memory system 1000' may be modified such that one memory chip is connected to one channel.

As described above, the memory system 1000' in accordance with an embodiment of the present disclosure includes the memory device 1200' having an improved degree of integration and improved characteristics, and thus the degree of integration and characteristics of the memory system 1000' can be improved. Particularly, the memory device 1200' is configured as a multi-chip package, so that the data storage capacity of the memory system 1000' can be increased, and the operation speed of the memory system 1000' can be improved.

Figure 6:
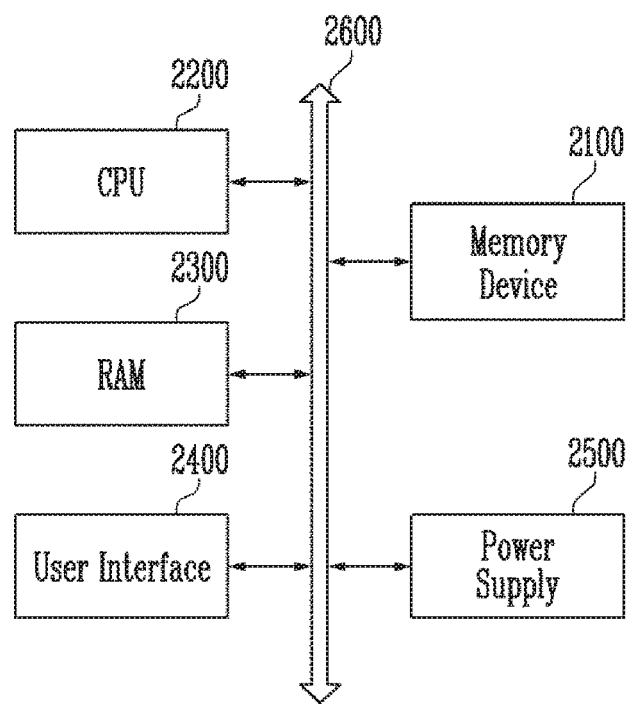
FIGS. 6 and 7 are block diagrams illustrating configurations of computing systems in accordance with embodiments of the present disclosure.

FIG. 6 is a block diagram illustrating a configuration of a computing system in accordance with an embodiment of the present disclosure. Hereinafter, description of contents overlapping with those described above will not be repeated.

Referring to FIG. 6, the computing system 2000 in accordance with an embodiment of the present disclosure may include a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or directly. When the memory device 2100 is directly connected to the system bus 2600, a function of the controller may be performed by the CPU 2200, the RAM 2300, etc.

The memory device 2100 may be a nonvolatile memory. Also, the memory device 2100 may have the structures described with reference to FIGS. 1A to 3K and may be manufactured according to the manufacturing method described with reference to FIGS. 1A to 3K. In an embodiment, the memory device 2100 may include: a stack structure; a source connection structure penetrating the stack structure; n first channel rows located at one side of the source connection structure, the n first channel rows including channel patterns; and n+k second channel rows located at the other side of the source connection structure, the n+k second channel rows channel patterns or dummy channel patterns. The structure and manufacturing method of the memory device 2100 are the same as described above, and therefore, their detailed descriptions will not be repeated.

The memory device 2100 may be a multi-chip package including a plurality of memory chips as described with reference to FIG. 5.

The computing system 2000 configured as described above may be a computer, an ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As described above, the computing system 2000 in accordance with an embodiment of the present disclosure includes the memory device 2100 having an improved degree of integration and improved characteristics, and thus characteristics of the computing system 2000 can also be improved.

Figure 7:
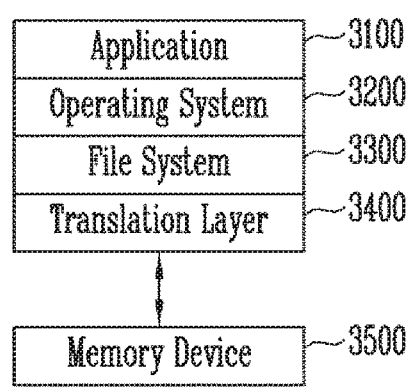

FIG. 7 is a block diagram illustrating a computing system in accordance with an embodiment of the present disclosure.

Referring to FIG. 7, the computing system 3000 in accordance with an embodiment of the present disclosure may include a software layer including an operating system 3200, an application 3100, a file system 3300, a translation layer 3400, and the like. In addition, the computing system 3000 may include a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory. Also, the memory device 3500 may have the structures described with reference to FIGS. 1A to 3K and may be manufactured according to the manufacturing method described with reference to FIGS. 1A to 3K. In an embodiment, the memory device 3500 may include: a stack structure; a source connection structure penetrating the stack structure; n first channel rows located at one side of the source connection structure, the n first channel rows including channel patterns; and n+k second channel rows located at the other side of the source connection structure, the n+k second channel rows channel patterns or dummy channel patterns. The structure and manufacturing method of the memory device 3500 are the same as described above, and therefore, their detailed descriptions will not be repeated.

The computing system 3000 configured as described above may be divided into an operating system layer performed in an upper level region and a controller layer performed in a lower level region. The application 3100, the operating system 3200, and the file system 3300 are included in the operating system layer, and may be driven by a working memory of the computing system 3000. In addition, the translation layer 3400 may be included in the operating system layer or the controller layer.

As described above, the computing system 3000 in accordance with an embodiment of the present disclosure includes the memory device 3500 having an improved degree of integration and improved characteristics, and thus characteristics of the computing system 3000 can also be improved.

In accordance with the present disclosure, there can be provided a semiconductor device having a stable structure and improved reliability. Also, in manufacturing of the semiconductor device, the level of difficulty of processes can be lowered, a manufacturing procedure can be simplified, and manufacturing cost can be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor device comprising:
   a stack structure;
   a first source connection structure penetrating the stack structure;
   a second source connection structure adjacent to the first source connection structure and penetrating the stack structure;
   a third source connection structure adjacent to the first source connection structure and penetrating the stack structure;
   n first channel rows located between the first source connection structure and the second source connection structure, the n first channel rows including channel patterns; and
   n+k second channel rows located between the first source connection structure and the third source connection structure, at least one channel row among the n+k second channel rows including dummy channel patterns,
   wherein the n and k are integers.

2. The semiconductor device of claim 1, wherein n channel rows among the second channel rows include channel patterns, and k channel rows among the second channel rows include dummy channel patterns.

3. The semiconductor device of claim 2, wherein, in an erase operation, an erase bias is applied through the dummy channel patterns.

4. The semiconductor device of claim 2, further comprising:
   first pads located over the channel patterns, the first pads including an impurity of a first type; and
   second pads located over the dummy channel patterns, the second pads including an impurity of a second type different from the first type.

5. The semiconductor device of claim 1, further comprising connection patterns located under the stack structure, the connection patterns coupling the first and second channel rows and the first to third source connection structures.

6. The semiconductor device of claim 5, wherein each of the first to third source connection structures includes:
   a first conductive pattern connected to the connection pattern; and
   a second conductive pattern connected to the first conductive pattern, the second conductive pattern having a resistance lower than that of the first conductive pattern.

7. The semiconductor device of claim 6, wherein the first conductive pattern includes poly-silicon, and the second conductive pattern includes a metal.

8. The semiconductor device of claim 1, wherein the stack structure includes:
   at least one first select line;
   a plurality of word lines formed over the at least one first select line;
   at least one second select line formed over the plurality of word lines; and
   separation insulating patterns penetrating the at least one select line, the separation insulating patterns overlapping with the channel row including dummy channel patterns.

9. The semiconductor device of claim 8, wherein the first select lines have a width narrower than that of the word lines.

10. The semiconductor device of claim 1, wherein the semiconductor device includes a plurality of memory blocks, and a first memory block and a second memory block among the plurality of memory blocks include different numbers of channel rows.

11. The semiconductor device of claim 10, wherein the first memory block includes n first channel rows and n second channel rows, and the second memory block includes n first channel rows and n+k second channel rows.

12. A semiconductor device comprising:
a first memory block including a first stack structure, first source connection structures adjacent to each other and first channel rows between the first source connection structures and penetrating the first stack structure; and
a second memory block including a second stack structure, second source connection structures adjacent to each other and second channel rows between the second source connection structures and penetrating the second stack structure,
wherein a number of the first channel rows is different from that of the second channel rows.

13. The semiconductor device of claim 12, wherein the first channel rows include channel patterns, and at least one channel row among the second channel rows includes dummy channel patterns.

14. The semiconductor device of claim 13, further comprising:
first pads located over the channel patterns, the first pads including an impurity of a first type; and
second pads located over the dummy channel patterns, the second pads including an impurity of a second type different from the first type.

15. A semiconductor device comprising:
a stack structure;
a first source connection structure penetrating the stack structure;
a second source connection structure adjacent to the first source connection structure and penetrating the stack structure;
a third source connection structure adjacent to the first source connection structure and penetrating the stack structure;
first channel rows formed in the stack structure and between the first source connection structure and the second source connection structure, the first channel rows including channel patterns; and
second channel rows formed in the stack structure and between the first source connection structure and the third source connection structure, the second channel rows including dummy channel patterns,
wherein a number of first channel rows is less than a number of second channel rows.

* * * * *